(12) United States Patent
Lin

(10) Patent No.: US 7,151,413 B2
(45) Date of Patent: Dec. 19, 2006

(54) LOW NOISE CHARGE PUMP FOR PLL-BASED FREQUENCE SYNTHESIS

(75) Inventor: Chi-Hung Lin, Taipei (TW)

(73) Assignee: Via Technologies Inc., Taipei (TW)

( * ) Notice: Subject to any disclaimer, the term of this patent is extended or adjusted under 35 U.S.C. 154(b) by 82 days.

(21) Appl. No.: 11/002,497

(22) Filed: Dec. 2, 2004

(65) Prior Publication Data

US 2006/0119438 A1  Jun. 8, 2006

(51) Int. Cl.
H03L 7/095 (2006.01)
H03L 7/24 (2006.01)

(52) U.S. Cl. .................... 331/11; 331/DIG. 2; 331/16; 327/157

(58) Field of Classification Search .......... 331/DIG. 2, 331/11, 16; 327/157
See application file for complete search history.

(56) References Cited

U.S. PATENT DOCUMENTS 6,130,561 A * 10/2000 Dufour ...................... 327/105
6,429,901 B1 * 8/2002 Kiyose et al. .............. 348/500
6,897,690 B1 * 5/2005 Keaveney et al. .......... 327/148
6,940,356 B1 * 9/2005 McDonald et al. .......... 331/16

* cited by examiner

Primary Examiner—Robert Pascal
Assistant Examiner—James Goodley
(74) Attorney, Agent, or Firm—Thomas, Kayden, Horstemeyer & Risley

(57) ABSTRACT

A low noise charge pump for use in a PLL-based frequency synthesizer. The charge pump includes a timing controller and a plurality of charge-pump circuits. The timing controller receives a reference signal to generate a plurality of enable signals having non-overlapping phases, where the frequency of each enable signal is equal to that of the reference signal divided by the number of the enable signals. The charge-pump circuits are coupled in parallel and operate in a time-interleaved manner according to the enable signals. In response to a first and second control signal, the charge-pump circuits are able to generate respective output currents which are multiplexed together to form a charge-pump current.

15 Claims, 3 Drawing Sheets

LOW NOISE CHARGE PUMP FOR PLL-BASED FREQUENCE SYNTHESIS

BACKGROUND OF THE INVENTION

1. Field of the Invention

The invention relates to a frequency synthesizer, and more particularly to a low noise charge pump for use in a PLL (Phase-Locked Loop) based frequency synthesizer.

2. Description of the Related Art

In recent years, the rapid growth of cellular communications systems has motivated an increasing demand for high performance integrated radio frequency (RF) components. One of the most important building blocks of these systems is the local oscillator (LO). In modern RF transceivers, the oscillators are usually embedded in a synthesizer environment so as to achieve a precise definition of the output frequency. Phase-locked loop (PLL) techniques have been widely used in frequency synthesis to meet the stringent requirements of wireless standards, because under locked condition the output frequency of a PLL bears an exact relationship with the input frequency.

A PLL-based synthesis technique offers high integration level, low power dissipation, small chip area, high reliability, and predictable performance. The comparison frequency (i.e., the reference frequency at the phase detector) in an integer-N frequency synthesizer is equal to the channel spacing, or step size. Thus, the integer-N frequency synthesizer with small channel spacing is not suitable for a system requiring rapid frequency acquisition as the loop bandwidth must be narrow enough to maintain the system stability. Another drawback results from the inverse relationship between the channel spacing and in-band phase noise. As the channel spacing decreases, the divide ratio of the frequency divider for a given local oscillator frequency range must increase. The higher the divide ratio, the worse the phase noise inside the loop bandwidth close to carrier frequency. It is known that the in-band phase noise is higher than the system noise floor by approximately an amount of 20 log N dB, where N is the total divide ratio. The output spurs are also related to the loop bandwidth. Therefore, trade-offs are necessary in determining the loop bandwidth and loop performance.

A fractional-N frequency synthesis technique enables the use of comparison frequencies larger than the channel spacing. This technique is able to considerably reduce the divide ratio N in the loop for the same channel spacing as that in an integer-N synthesizer, while using the highest possible comparison frequency. The fractional-N synthesis has a significant beneficial effect on the in-band phase noise performance. The possibility of using a higher comparison frequency also opens up the way to a wider loop bandwidth, hence a faster lock transient. Using a comparison frequency higher than the channel spacing can reduce the reference spurs at the output. Nevertheless, the use of the fractional-N technique introduces periodic disturbances in the loop, resulting in large fractional spurs.

A fundamental element of the PLL is a charge-pump circuit, because this circuit dominates the output frequency of a voltage-controlled oscillator (VCO). To meet the high switching speed requirement of RF transceivers, a high-speed charge pump must be employed in the integrated circuit implementation. During the charge pump switching time, switching noise may introduce spikes onto the output. This is detrimental to the performance of the PLL or frequency synthesizer and, when implemented in an RF transceiver, ultimately degrades the signal quality and clarity (selectivity). It is desirable to decrease the charge pump operating speed from the standpoint of noise reduction. However, the charge pump operating frequency is dictated by the comparison frequency. As the comparison frequency increases, the noise floor of the charge pump is raised. Hence, there exists a trade-off between the charge pump operating frequency and the noise performance.

In view of the above, there is a need for a low noise charge pump that overcomes the problems of the related art.

SUMMARY OF THE INVENTION

The present invention is generally directed to a low noise charge pump for use in a PLL-based frequency synthesizer. According to one aspect of the invention, the charge pump includes a timing controller and a plurality of charge-pump circuits. The timing controller receives a reference signal to generate a plurality of enable signals with non-overlapping phases, where the frequency of each enable signal is equal to the frequency of the reference signal divided by the number of the enable signals. The charge-pump circuits are coupled in parallel and operate in a time-interleaved manner according to the enable signals. In response to a first and second control signal, the charge-pump circuits are able to generate their respective output currents which are multiplexed together to form a charge-pump current. Therefore, each of the charge-pump circuits operates at a rate m times slower than the frequency of the reference signal, where m is the number of the charge-pump circuits.

According to another aspect of the invention, a low noise frequency synthesizer is disclosed. The frequency synthesizer includes a low pass filter, a voltage-controlled oscillator, a frequency divider, a phase detector, and a plurality of charge-pump circuits. The charge-pump circuits are coupled in parallel; they operate in a time-interleaved manner to supply a charge-pump current. The low pass filter develops a frequency control voltage in response to the charge-pump current. The voltage-controlled oscillator generates an output clock signal of variable frequency in response to the frequency control voltage. The frequency divider is responsible for dividing the frequency of the output clock signal by a given divide ratio. The phase detector is capable of detecting phase difference between a reference signal and a frequency divided version of the output clock signal to generate a first and second control signal. In response to the first and the second control signals, the charge-pump circuits are configured to generate a plurality of net output currents, respectively. Thus, the net output currents are multiplexed together at a common output node to form the charge-pump current.

In one embodiment of the present invention, a low noise charge pump is made up of a timing controller, a reference current source, and a plurality of charge-pump circuits. The timing controller receives a reference signal to generate a plurality of enable signals with non-overlapping phases, where the frequency of each enable signal is equal to the frequency of the reference signal divided by the number of enable signals. The reference current source is used to supply a bias current. The charge-pump circuits having a common output node are coupled in parallel. According to the enable signals, the charge-pump circuits are able to generate their respective net output currents in a time-interleaved manner. At the common output node, the net output currents are multiplexed together to form a charge-pump current. Each charge-pump circuit includes two switches and two current steering units. A first switch that receives a first control signal is coupled to the reference current source. During assertion of the first control signal, the first switch allows the bias current to be mirrored as a pump-up current. A first current steering unit is coupled between the first switch and the common output node to steer the pump-up current. On the other hand, a second switch that receives a second control signal is coupled to the reference current source as well. During assertion of the second control signal, the second switch allows the bias current to be mirrored as a pump-down current. A second current steering unit is coupled between the second switch and the common output node to steer the pump-down current. Specifically, the first and the second steering units are controlled by a corresponding enable signal from the timing controller. During assertion of the corresponding enable signal, the pump-up current is directed towards the common node while the pump-down current is directed away from the common output node. In this way, one of the net output currents is developed at the common output node.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
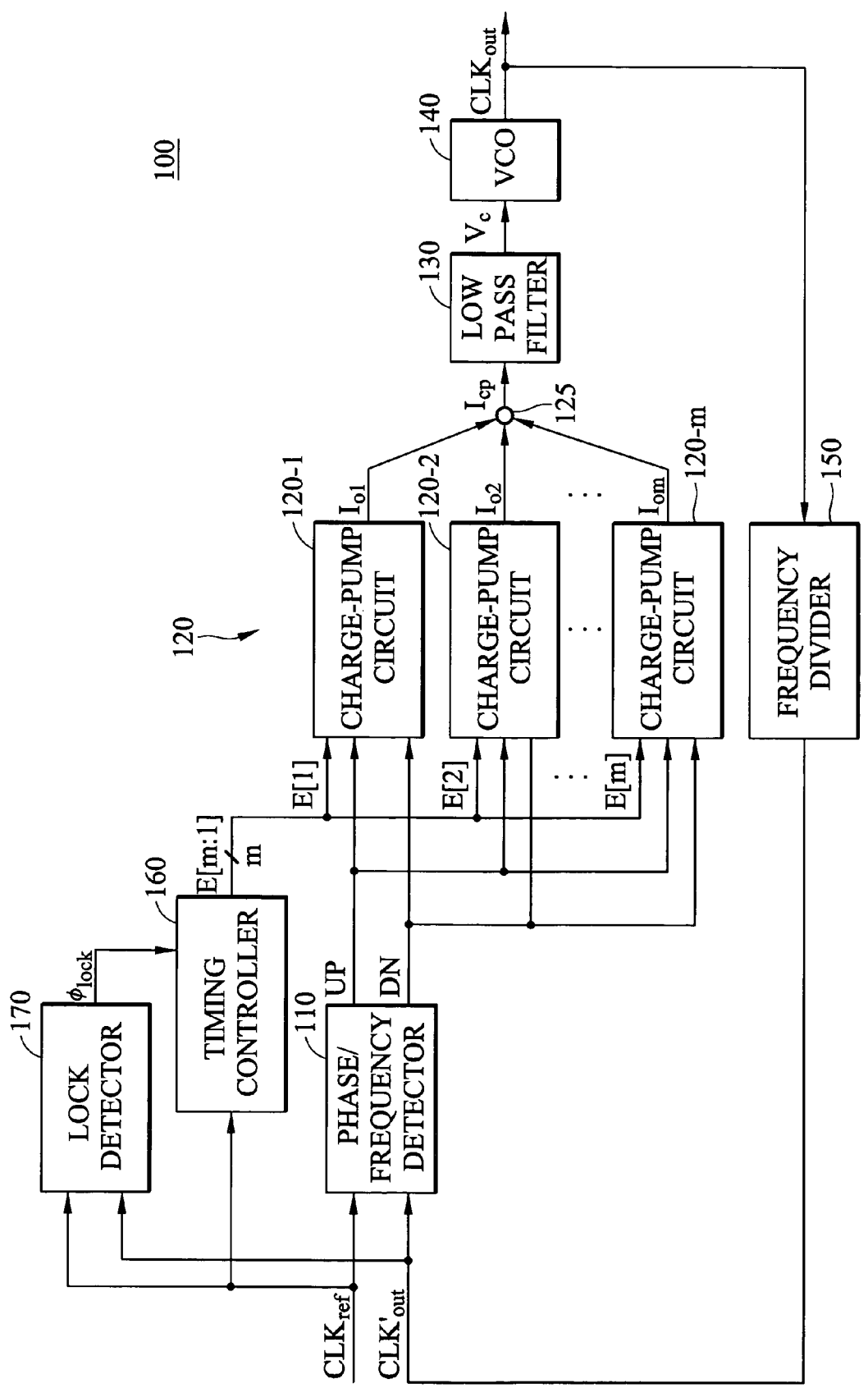
FIG. 1 is a block diagram of a PLL-based frequency synthesizer according to the invention.

With reference to FIG. 1, a PLL-based frequency synthesizer of the invention is illustrated and identified by the reference numeral 100. The frequency synthesizer 100 is designed to receive a reference signal $CLK_{ref}$ having a frequency of $F_{ref}$ and generate an output clock signal $CLK_{out}$ having a frequency of $F_{out}$, where the $CLK_{out}$ signal is synchronized with the $CLK_{ref}$ signal in phase. As depicted, the basic building blocks of the frequency synthesizer 100 include a phase/frequency detector 110, a charge pump 120, a low pass filter 130, a voltage-controlled oscillator (VCO) 140, and a frequency divider 150. The frequency synthesizer 100 further comprises a timing controller 160 and a lock detector 170. The phase/frequency detector 110 is capable of detecting phase difference between the $CLK_{ref}$ signal and a feedback signal $CLK'_{out}$ to generate control signals UP and DN which, in turn, direct the charge pump 120 to either source or sink current to or from the low pass filter 130. The UP and DN signals typically take the form of pulses having a width or duration corresponding to the phase difference between the reference and the feedback signals. The $CLK_{ref}$ signal and the $CLK'_{out}$ signal are also coupled to the lock detector 170 where the phase alignment of the two signals is examined. When the two phases are aligned, i.e., the phase of the $CLK'_{out}$ signal is locked onto the phase of the $CLK_{ref}$ signal, the PLL-based frequency synthesizer 100 is said to be in a "locked" condition. The lock detector 170 is able to produce a state signal, $\phi_{lock}$, indicating whether the locked condition occurs. The timing controller 160 also accepts the $CLK_{ref}$ signal at its input and receives the $\phi_{lock}$ signal from the lock detector 170. If the $\phi_{lock}$ signal indicates that the locked condition is detected, the timing controller 160 generate a plurality of enable signals with non-overlapping phases where the frequency of each enable signal is equal to the frequency of the $CLK_{ref}$ signal divided by the number of the enable signals. Here the m number of enable signals are grouped into an m-bit signal denoted by E[m:1]. If the locked condition has not been detected yet according to the $\phi_{lock}$ signal, the timing controller 160 can load a default value onto the m-bit signal E[m:1] for rapid frequency tracking and acquisition.

According to the invention, the charge pump 120 is preferably composed of a plurality of charge-pump circuits 120-1 through 120-m as shown in FIG. 1. The charge-pump circuits 120-1 through 120-m receiving the same UP and DN signals are connected in parallel. Further, each bit of the m-bit signal E[m:1] is fed to a corresponding charge-pump circuit. Under control of the m-bit signal E[m:1], the charge-pump circuits 120-1 through 120-m are enabled to operate in a time-interleaved manner. In the phase-locked state, the charge-pump circuits are time interleaved and each operates at a rate m times slower than $F_{ref}$ so that output currents $I_{o1}$–$I_{om}$ towards a common node 125 are supplied one at a time. The currents $I_{o1}$ through $I_{om}$ are multiplexed together to form a charge-pump current $I_{cp}$ at the common node 125. In response to the charge-pump current $I_{cp}$, the low pass filter 130 develops a frequency control voltage $V_c$. The VCO 140 is capable of generating a clock signal of variable frequency in response to the voltage $V_c$. As such, the $CLK_{out}$ signal's frequency $F_{out}$ is dependent on the magnitude of the voltage $V_c$. The frequency divider 150 is used to divide the frequency of the $CLK_{out}$ signal by a given divide ratio. The output of frequency divider 150, namely the $CLK'_{out}$ signal, is provided as feedback to the phase/frequency detector 110. In one embodiment, the frequency divider 150 is organized in integer-N architecture and the divide ratio is an integer number of N. Alternatively, the frequency divider 150 is organized in fractional-N architecture and the divide ratio is expressed as N.f, where the "." denotes a decimal point and N and f represent the integer and fractional parts of the divide ratio.

Figure 2:
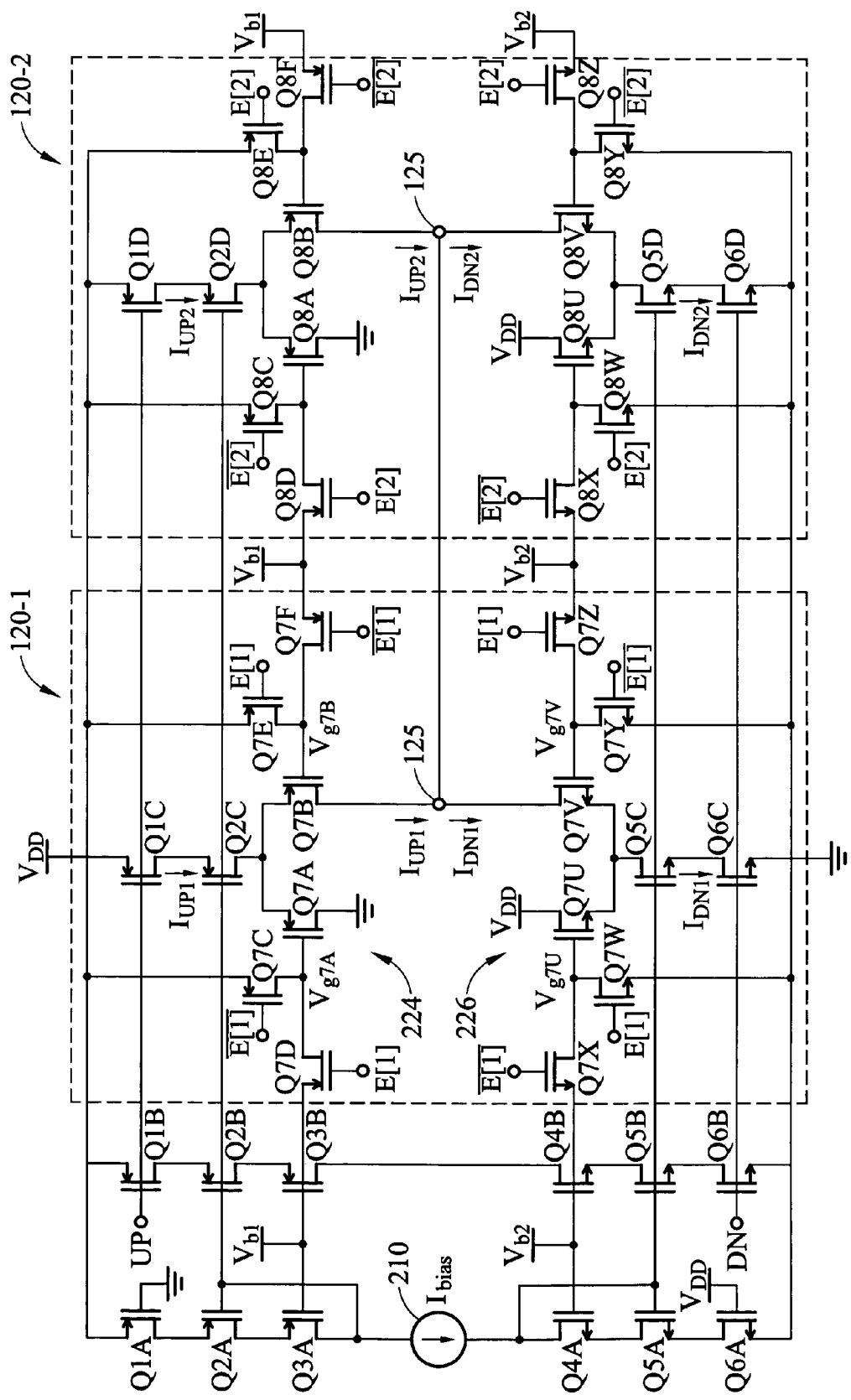
FIG. 2 is a schematic diagram of a charge pump according to an embodiment of the invention.

The features of the invention will be more clearly understood by way of an exemplary embodiment of the charge pump 120. Each transistor described herein is either a p-channel or n-channel MOS transistor having a gate, a drain and a source. Since a MOS transistor is typically a symmetrical device, the true designation of "source" and "drain" is only possible once a voltage is impressed on the terminals. The designations of source and drain herein should be interpreted, therefore, in the broadest sense. With reference to FIG. 2, the charge pump 120 includes, but is not limited to, for example, two charge-pump circuits 120-1 and 120-2 having the common output node 125. A reference current source 210 is incorporated in the charge pump 120 to supply a bias current $I_{bias}$. Transistors Q1A–B, Q2A–B, and Q3A–B are arranged in a current-mirror configuration for supplying a current towards the common output node 125. Also, transistors Q4A–B, Q5A–B, and Q6A–B are arranged in the similar-current-mirror configuration for draining a current from the common output node 125.

Each of the charge-pump circuits internally delivers a pump-up current and a pump-down current in response to the control signals UP and DN. As depicted, the charge-pump circuit 120-1 is constituted by transistors Q1C, Q2C, Q5C, Q6C, Q7A–F, and Q7U–Z, while the charge-pump circuit 120-2 contains transistors Q1D, Q2D, Q5D, Q6D, Q8A–F, and Q8U–Z. Each charge-pump circuit features the same architecture and can be divided into several major blocks including two switches and two current steering units. Taking the charge-pump circuit 120-1 as an example, the transistors Q1C and Q6C serve as switches which accept the UP and DN signals at their gates, respectively. The transistors Q7A–F play the current steering role in the charge-pump circuit 120-1; they together constitute a current steering unit 224 coupled between the switch Q1C and the common output node 125. Likewise, the transistors Q7U–Z form a current steering unit 226 coupled between the switch Q6C and the common output node 125. The switching transistors Q1C and Q6C are both coupled to the reference current source 210 via the current-mirror circuits. A transistor Q2C interposed between the switch Q1C and the current steering unit 224 is the matching part of the mirror transistor Q2B. In one embodiment, the current steering unit 224 is organized in a gate-switched configuration in which the transistors Q7A and Q7B are coupled as a differential pair. This differential pair is separately controlled by the transistors Q7C–D and the transistors Q7E–F. The transistor Q7A has its drain coupled to ground and its gate coupled to the drains of transistors Q7C and Q7D. Correspondingly, the transistor Q7B has its drain coupled to the common output node 125 and its gate coupled to the drains of transistors Q7E and Q7F. The sources of transistors Q7A and Q7B are connected together to the drain of transistor Q2C. The transistor Q7D has its source coupled to a bias voltage $V_{B1}$ and accepts the enable signal E[1] at its gate. The transistor Q7C has its source coupled to a voltage supply $V_{DD}$ and accepts the enable signal $\overline{E[1]}$ at its gate. On the other hand, the transistor Q7F has its source coupled to the bias voltage $V_{B1}$ and accepts the enable signal $\overline{E[1]}$ at its gate. The transistor Q7E has its source coupled to the voltage supply $V_{DD}$ and accepts the enable signal E[1] at its gate. The $\overline{E[1]}$ signal is simply the complement of E[1]. Moreover, the gate of transistor Q2C is coupled to the gates of transistors Q2A and Q2B. The transistor Q1C has its source coupled to the voltage supply $V_{DD}$, has its drain coupled to the source of transistor Q2C, and accepts the UP signal at its gate.

In a similar fashion, a transistor Q5C interposed between the switch Q6C and the current steering unit 226 is the matching part of the mirror transistor Q5B. In one embodiment, the current steering unit 226 is also organized in the gate-switched configuration in which the transistors. Q7U and Q7V are coupled as a differential pair. This differential pair is separately controlled by the transistors Q7X–W and the transistors Q7Y–Z. The transistor Q7U has its drain coupled to the voltage supply $V_{DD}$ and its gate coupled to the drains of transistors Q7X and Q7W. Correspondingly, the transistor Q7V has its drain coupled to the common output node 125 and its gate coupled to the drains of transistors Q7Y and Q7Z. The sources of transistors Q7U and Q7V are connected together to the drain of transistor Q5C. The transistor Q7X has its source coupled to another bias voltage $V_{B2}$ and accepts the enable signal $\overline{E[1]}$ at its gate. The transistor Q7W has its source coupled to the ground and accepts the enable signal E[1] at its gate. On the other hand, the transistor Q7Z has its source coupled to the bias voltage $V_{B2}$ and accepts the enable signal E[1] at its gate. The transistor Q7Y has its source coupled to the ground and accepts the enable signal $\overline{E[1]}$ at its gate. Furthermore, the gate of transistor Q5C is coupled to the gates of transistors Q5A and Q5B. The transistor Q6C has its source coupled to the ground, has its drain coupled to the source of transistor Q5C, and accepts the DN signal at its gate.

Figure 3:
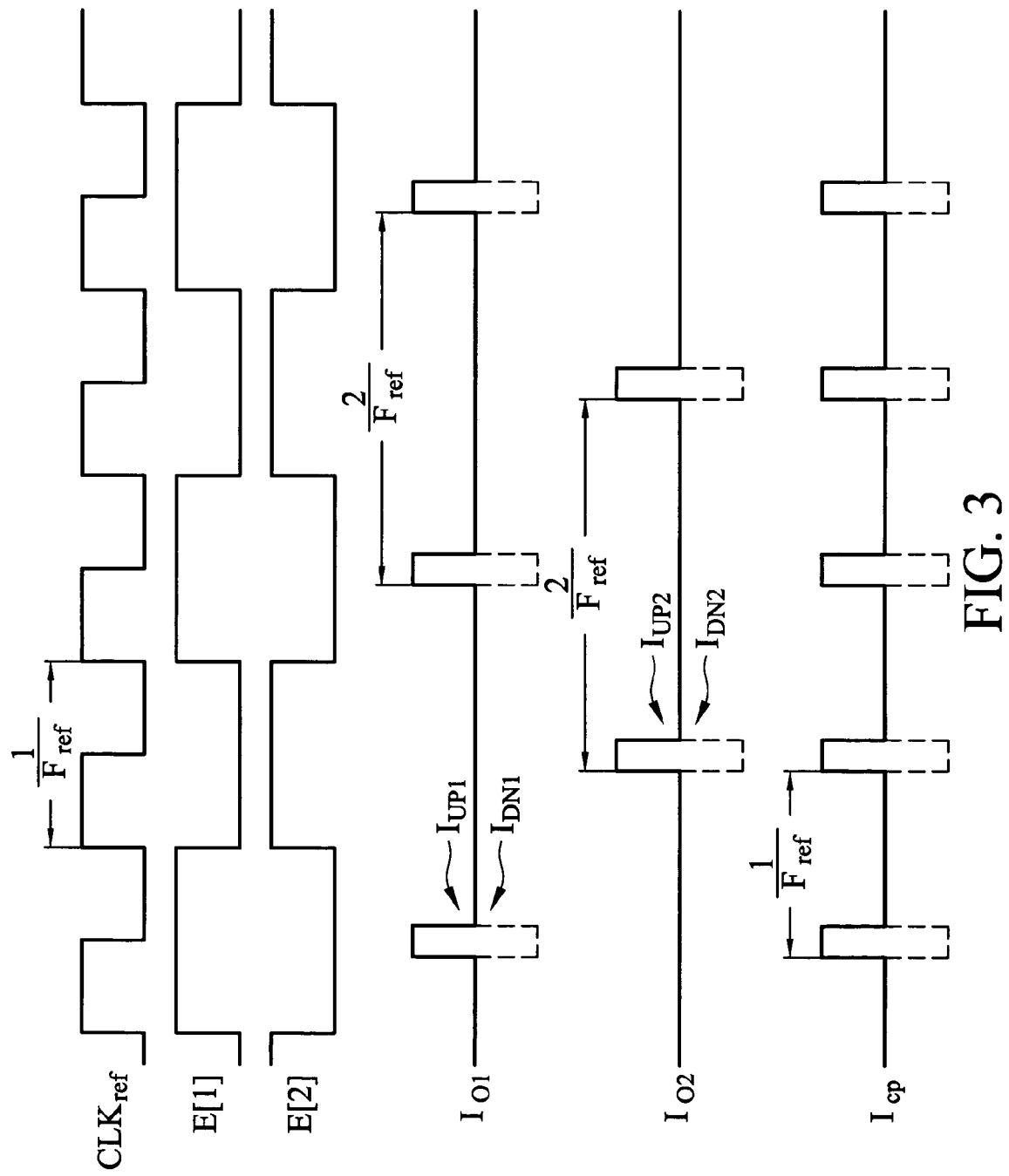
FIG. 3 is a waveform diagram illustrating the operational characteristics of the charge pump of FIG. 2.

The operation of the charge-pump circuits 120-1 and 120-2 will now be explained in conjunction with FIGS. 2 and 3. In operation, the transistors Q1B–D are turned on during assertion of the UP signal so that the current $I_{bias}$ is mirrored as pump-up currents $I_{up1}$ and $I_{up2}$ while the transistors Q6B–D are turned on during assertion of the DN signal so that the current $I_{bias}$ is mirrored as pump-down currents $I_{dn1}$ and $I_{dn2}$. The pump-up currents $I_{up1-2}$ and the pump-down currents $I_{dn1-2}$ are proportional in magnitude to the bias current $I_{bias}$, respectively. Additionally, the magnitude of each pump-up current is substantially equal to the magnitude of each pump-down current. During assertion of the enable signal E[1], i.e., E[1] is logic '1' and $\overline{E[1]}$ is logic '0', the transistors Q7C, Q7F, Q7W and Q7Z are turned on and the transistors Q7D, Q7E, Q7X and Q7Y are turned off. In this case, the differential voltages $V_{g7A}$ and $V_{g7B}$ are made "high" enough and "low" enough, respectively, and the other differential voltages $V_{g7U}$ and $V_{g7V}$ are made "low" enough and "high" enough, respectively. Thus the transistors Q7B and Q7V are turned on while the transistors Q7A and Q7U are turned off. Consequently, the $I_{up1}$ current flowing through the transistor Q2C is directed towards the common node 125. At the same time, the $I_{dn1}$ current flowing through the transistor Q5C is directed away from the common output node 125.

When the enable signal E[1] is deasserted, i.e., E[1] is logic '0' and $\overline{E[1]}$ is logic '1', the transistors Q7D, Q7E, Q7X and Q7Y are turned on and the transistors Q7C, Q7F, Q7W and Q7Z are turned off. In this case, the differential voltages $V_{g7A}$ and $V_{g7B}$ are made "low" enough and "high" enough, respectively, and the other differential voltages $V_{g7U}$ and $V_{g7V}$ are made "high" enough and "low" enough, respectively. Thus the transistor Q7A is turned on and the transistor Q7B is turned off. This prevents the $I_{up1}$ current from flowing into the common output node 125. In the meantime, the transistor Q7U is turned on and the transistor Q7V is turned off so the $I_{dn1}$ current is directed to the voltage supply $V_{DD}$ via transistor Q7U, thereby preventing the $I_{dn1}$ current from flowing out of the common output node 125. As a result, the net output current of the charge-pump circuit 120-1 is blocked by the current steering units 224 and 226 during deassertion of the enable signal E[1]. Because the enable signals E[1] through E[m] have the same frequency of $F_{ref}/m$ but have the non-overlapping phases, one of the charge-pump circuits is allowed to supply a current for increasing or decreasing the frequency control voltage $V_c$ while the others are disabled to supply their respective currents. In the case of the exemplary embodiment, the charge-pump circuit 120-1 is allowed to supply the $I_{up1}$ current towards the node 125 and drain the $I_{dn1}$ current from the node 125 while the charge-pump circuit 120-2 is disabled to direct the $I_{up2}$ and $I_{dn2}$ currents to and from the node 125, and vice versa.

Usually, currents directed towards a node are taken as positive and those directed away are taken as negative. As shown in FIG. 3, the pump-up currents $I_{up1}$ and $I_{up2}$ are denoted by positive-going waveforms and the pump-down currents $I_{dn1}$ and $I_{dn2}$ are denoted by negative-going waveforms. According to the Kirchhoff's current law, the net output currents of the charge-pump circuits 120-1 and 120-2 can be expressed as: $I_{o1}=I_{up1}-I_{dn1}$ and $I_{o2}=I_{up2}-I_{dn2}$, respectively. At the common node 125, the currents $I_{o1}$ and $I_{o2}$ are multiplexed together to form the charge-pump current $I_{cp}$. It is shown that the charge-pump circuits 120-1 and 120-2 are time interleaved and operating at a rate two times slower than a conventional charge pump. As compared with the conventional charge pump, the noise performance of the exemplary embodiment can be improved by 20 log 2=6 dB with respect to the same comparison frequency. Therefore, an improvement of 20 log m dB can be achieved in application of m number of charge-pump circuits. It should be understood to those skilled in the art that other transistor technologies are contemplated to implement the transistors illustrated in FIG. 2 by the principles of the invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A low noise charge pump comprising:
a timing controller receiving a reference signal for generating a plurality of enable signals with non-overlapping phases, where the frequency of each enable signal is equal to the frequency of said reference signal divided by the number of said enable signals;
a reference current source for supplying a bias current;
a plurality of charge-pump circuits coupled in parallel and having a common output node, for generating a plurality of net output currents in a time-interleaved manner according to said plurality of enable signals where said plurality of net output currents are multiplexed together to form a charge-pump current at said common output node, each charge-pump circuit comprising:
a first switch coupled to said reference current source and receiving a first control signal, for allowing said bias current to be mirrored as a pump-up current during assertion of said first control signal;
a second switch coupled to said reference current source and receiving a second control signal, for allowing said bias current to be mirrored as a pump-down current during assertion of said second control signal;
a first current steering unit coupled between said first switch and said common output node for steering said pump-up current;
a second current steering unit coupled between said second switch and said common output node for steering said pump-down current;
wherein said first and said second steering units are controlled by a corresponding enable signal from said timing controller;
wherein said pump-up current is directed towards said common node and said pump-down current is directed away from said common output node during assertion of said corresponding enable signal, thereby one of said net output currents is developed at said common output node.

2. The charge pump as recited in claim 1 wherein each of said charge-pump circuits operates at a rate m times slower than the frequency of said reference signal, where m is the number of said charge-pump circuits.

3. The charge pump as recited in claim 1 wherein one of said net output currents is blocked by said first and said second steering units when said corresponding enable signal is deasserted.

4. The charge pump as recited in claim 3 wherein said first steering unit in one of said charge-pump circuits prevents said pump-up current from flowing into said common output node when said corresponding enable signal is deasserted.

5. The charge pump as recited in claim 3 wherein said second steering unit in one of said charge-pump circuits prevents said pump-down current from flowing out of said common output node when said corresponding enable signal is deasserted.

6. A frequency synthesizer comprising:
a low pass filter for developing a frequency control voltage in response to a charge-pump current;
a voltage-controlled oscillator for generating an output clock signal of variable frequency in response to said frequency control voltage;
a frequency divider for dividing the frequency of said output clock signal by a given divide ratio;
a phase detector for detecting phase difference between a reference signal and a frequency divided version of said output clock signal to generate a first and second control signal; and
a plurality of charge-pump circuits coupled in parallel and operating in a time-interleaved manner, for generating a plurality of net output currents in response to said first and said second control signals, respectively, where said plurality of net output currents are multiplexed together at a common output node to form a charge-pump current, wherein each of said charge-pump circuits comprises:
a first switch receiving said first control signal and coupled to a reference current source supplying a bias current, for allowing said bias current to be mirrored as a pump-up current during assertion of said first control signal;
a second switch receiving said second control signal and coupled to said reference current source, for allowing said bias current to be mirrored as a pump-down current during assertion of said second control signal;
a first current steering unit coupled between said first switch and said common output node for steering said pump-up current under control of a corresponding enable signal that is received from said timing controller, said pump-up current being directed towards said common node during assertion of said corresponding enable signal; and
a second current steering unit coupled between said second switch and said common output node for steering said pump-down current under control of said corresponding enable signal, said pump-down current being directed away from said common node during assertion of said corresponding enable signal;
whereby one of said net output currents is developed at said common output node.

7. The frequency synthesizer as recited in claim 6 further comprising a timing controller receiving said reference signal to generate a plurality of enable signals with non-overlapping phases once a locked condition is detected, in which the frequency of each enable signal is equal to the frequency of said reference signal divided by the number of said enable signals.

8. The frequency synthesizer as recited in claim 7 wherein each of said charge-pump circuits operates at a rate m times slower than the frequency of said reference signal, where m is the number of said charge-pump circuits.

9. The frequency synthesizer as recited in claim 6 wherein one of said net output currents is blocked by said first and said second current steering units when said corresponding enable signal is deasserted.

10. The frequency synthesizer as recited in claim 9 wherein said first current steering unit in one of said charge-pump circuits prevents said pump-up current from flowing into said common output node when said corresponding enable signal is deasserted.

11. The frequency synthesizer as recited in claim 9 wherein said second current steering unit in one of said charge-pump circuits prevents said pump-down current from flowing out of said common output node when said corresponding enable signal is deasserted.

12. The frequency synthesizer as recited in claim 7 wherein said timing controller loads a default value onto said enable signals for frequency acquisition if said locked condition has not been detected yet.

13. The frequency synthesizer as recited in claim 6 wherein the magnitude of said pump-up current is substantially equal to the magnitude of said pump-down current, and said pump-up and said pump-down currents are proportional in magnitude to said bias current, respectively.

14. The frequency synthesizer as recited in claim 6 wherein said frequency divider is organized in integer-N architecture and said divide ratio is an integer number of N.

15. The frequency synthesizer as recited in claim 13 wherein said frequency divider is organized in fractional-N architecture and said divide ratio is expressed as N.f, where the dot denotes a decimal point and N and f represent the integer and fractional parts of said divide ratio.

* * * * *